US 6,727,762 B1

(12) United States Patent
Kobayashi

(10) Patent No.: US 6,727,762 B1
(45) Date of Patent: Apr. 27, 2004

(54) DIRECT COUPLED DISTRIBUTED AMPLIFIER

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 0 days.

(21) Appl. No.: 10/304,593

(22) Filed: Nov. 26, 2002

(51) Int. Cl.[7] ................................................ H03F 3/68
(52) U.S. Cl. ........................................ 330/295; 330/286
(58) Field of Search ............................... 330/310, 302, 330/311, 296, 286, 54, 57, 295, 124 R

(56) References Cited

U.S. PATENT DOCUMENTS

| | | | |
|---|---|---|---|
| 5,365,197 A | 11/1994 | Ikalainen | 330/286 |
| 5,880,640 A | 3/1999 | Dueme | 330/303 |
| 6,049,250 A | 4/2000 | Kintis et al. | 330/54 |
| 6,377,125 B1 * | 4/2002 | Pavio et al. | 330/286 |
| 2003/0184383 A1 * | 10/2003 | Ogawa | 330/286 |

* cited by examiner

Primary Examiner—Michael B. Shingleton
(74) Attorney, Agent, or Firm—Christopher P. Maiorana, P.C.

(57) ABSTRACT

An apparatus comprising an input stage, an output stage, a bias circuit and a feedback circuit. The input stage may be configured to generate a plurality of intermediate signals in response to an input signal. The output stage may be (i) DC coupled to the input stage and (ii) configured to generate an output signal in response to the intermediate signals. The output stage generally comprises a plurality of distributed amplifiers each configured to receive one of the intermediate signals. The bias circuit may be (i) connected between the input stage and the output stage and (ii) configured to adjust an input impedance of the input stage.

27 Claims, 8 Drawing Sheets

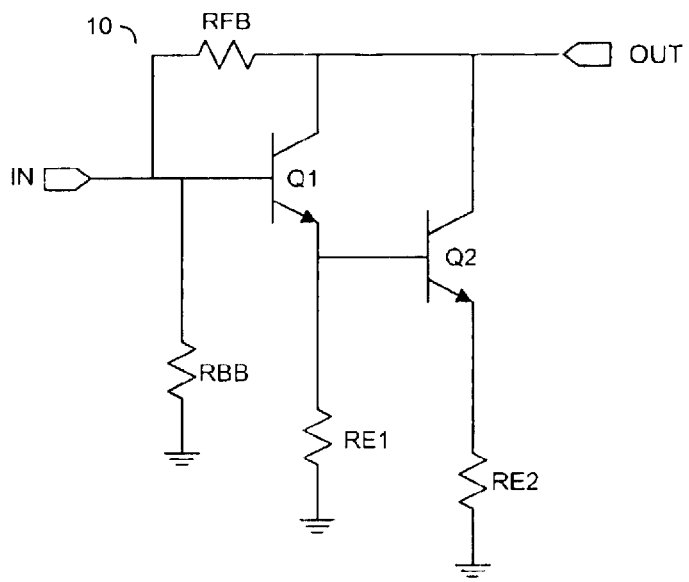
(CONVENTIONAL)
FIG. 1
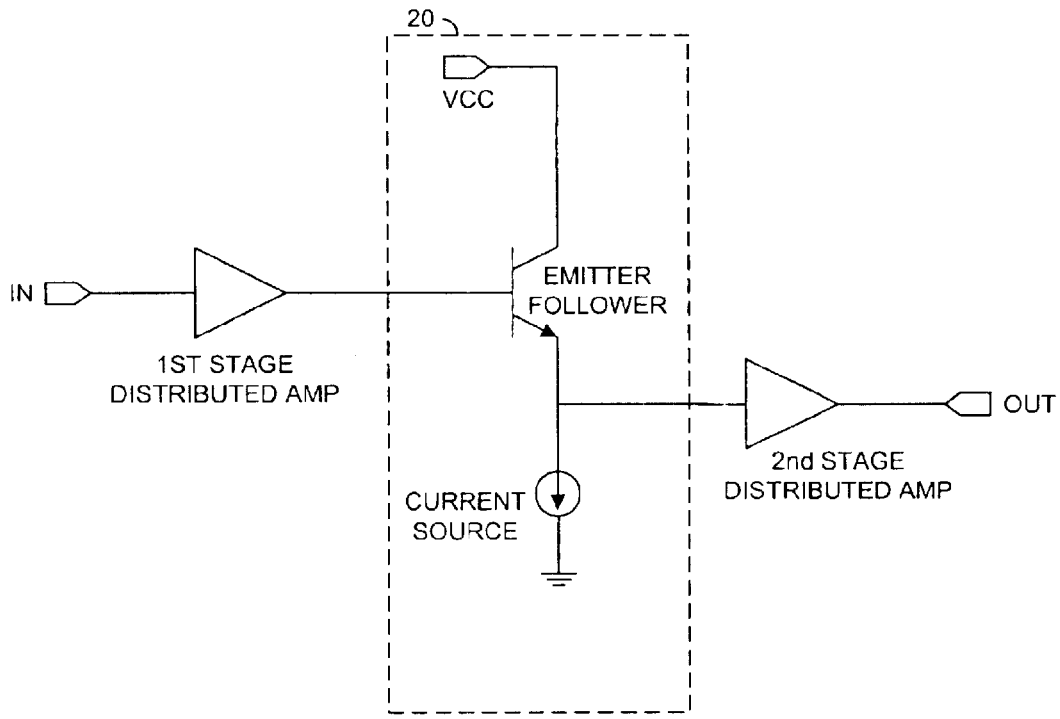
(A) DIRECT COUPLED EMITTER OR SOURCE FOLLOWER
(CONVENTIONAL)
FIG. 2

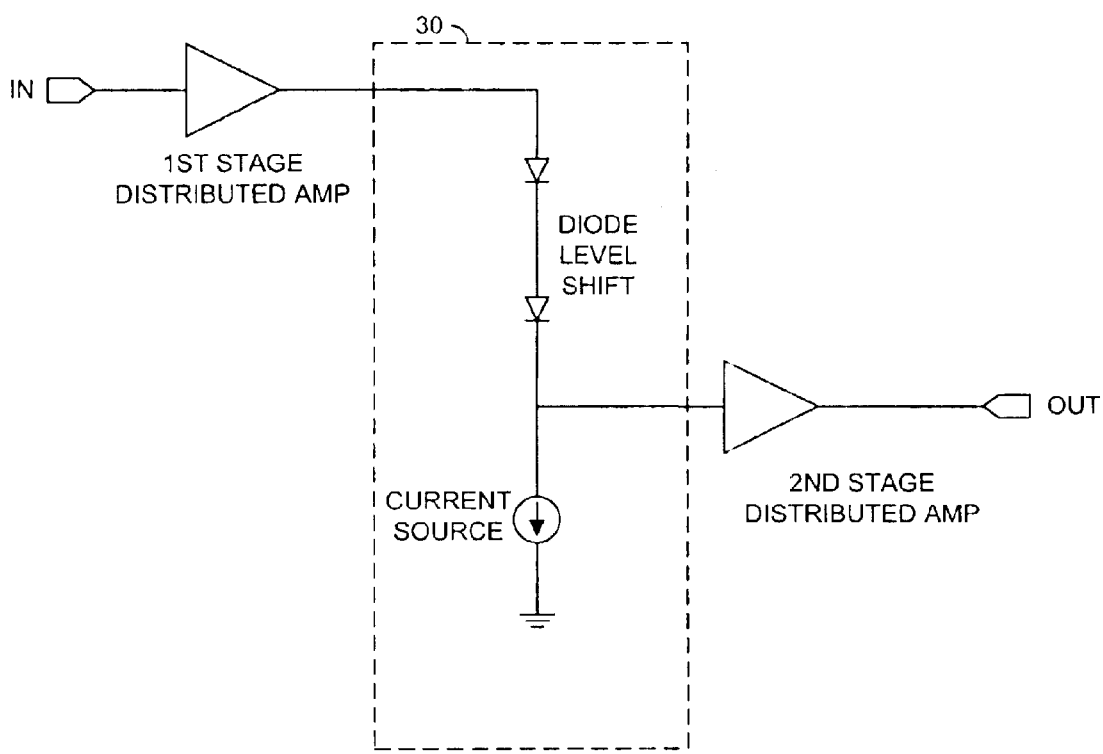
(B) DIRECT COUPLED DIODE LEVEL SHIFT
(CONVENTIONAL)
FIG. 3

DIRECT COUPLED DISTRIBUTED AMPLIFIER

FIELD OF THE INVENTION

The present invention relates to a method and/or architecture for implementing amplifiers generally and, more particularly, to a method and/or architecture for implementing a direct coupled distributed amplifier.

BACKGROUND OF THE INVENTION

Direct coupled amplifiers operating beyond 50 GHz are needed for test instrumentation, fiber optic systems, and satellite communication systems. Conventional lumped element analog feedback topologies can easily obtain direct coupled performance, but are typically limited in bandwidth by the RC parasitics of the transistors and interconnects. Conventional distributed amplifier topologies achieve wide bandwidths by absorbing transistor and interconnect parasitics into the design, but are difficult to directly DC couple. Conventional distributed amplifier topologies also tend to implement large termination bypass capacitors and are often spatially inefficient.

Several conventional approaches are presently used to satisfy the need for high gain-bandwidth direct-coupled amplification. One approach is a resistive feedback lumped element analog topology, such as the Darlington feedback amplifier. However, the performance of a Darlington feedback amplifier ultimately impaired by device and interconnect parasitics. Another approach used is to directly cascade distributed amplifiers using source/emitter follower and/or diode level shift circuits to obtain higher gain-bandwidth. However, directly cascaded conventional distributed amplifiers suffer from the expense of size, stability, poor interstage voltage standing wave ratio (VSWR) and/or group delay and/or gain ripple.

Referring to FIG. 1, a conventional Darlington amplifier 10 is shown. The conventional Darlington amplifier 10 is noted for having wide bandwidth capability. Because of the direct-coupled topology, the conventional Darlington amplifier 10 allows gain performance down to DC. The upper bandwidth performance is, however, ultimately limited by device and interconnect parasitics which have a profound impact at microwave frequencies.

In order to achieve high gain-bandwidth, distributed amplifiers have been directly coupled through the use of emitter or source followers and/or diode level shifter circuits. FIG. 2 illustrates a conventional emitter or source follower (or circuit) 20. FIG. 3 illustrates a conventional diode level shifter (or circuit) 30. The circuit 20 and the circuit 30 provide DC coupling between distributed amplifiers at the expense of higher power consumption, larger size (about twice the die area of a single stage distributed amplifier) and potential instability and gain ripple problems. In addition, conventional distributed amplifiers incorporate large termination bypass capacitors (not shown) to obtain base band performance and thus implement several off-chip components.

Referring to FIG. 4, a performance of a traditional analog direct coupled feedback amplifier is shown. Analog direct coupled feedback amplifiers are characteristic of flat responses down to baseband because of the absence of frequency limiting capacitor and inductor networks. A forward transmission (i.e., insertion) scattering parameter (i.e., S21) can have a clean performance from baseband to the 3-db BW requirement of greater than 35 GHz for a 40 Gb/s operation. An input reflection scattering parameter (i.e., S11) should also be consistent over the bandwidth. In particular, the parameter S11 should reflect a constant impedance across the band to ensure flat transimpedance performance. The output reflection scattering parameter (i.e., S22) should be better than 10 dB across the band. The log plot shows that the direct coupled topology achieves consistent baseband behavior.

Referring to FIG. 5, a linear frequency performance of the traditional analog direct coupled topology is shown. Gain and input return-loss degrade at higher frequencies due to device and interconnect parasitics. Specifically, capacitive parasitics tend to roll-off the forward transmission gain (i.e., S21) as the frequency increases. The input return-loss (i.e., input reflection coefficient S11) reduces the input impedance at higher frequencies. The output reflection coefficient (i.e., S22) remains relatively constant at all frequencies.

It would be desirable to obtain the consistent baseband performance of a direct coupled device while being implemented in a compact area while achieving high frequency bandwidth performance similar to performance obtained from distributed amplifier designs.

SUMMARY OF THE INVENTION

The present invention concerns an apparatus comprising an input stage, an output stage, a bias circuit and a feedback circuit. The input stage may be configured to generate a plurality of intermediate signals in response to an input signal. The output stage may be (i) DC coupled to the input stage and (ii) configured to generate an output signal in response to the intermediate signals. The output stage generally comprises a plurality of distributed amplifiers each configured to receive one of the intermediate signals. The bias circuit may be (i) connected between the input stage and the output stage and (ii) configured to adjust an input impedance of the input stage.

The objects, features and advantages of the present invention include providing a direct coupled distributed amplifier that may (i) have a distributed common emitter input stage directly DC coupled to a second common emitter, (ii) implement a Darlington distributed stage that is scalable, (iii) provide cascadable wide band performance, (iv) have scalability to N number of directly DC coupled distributed amplifier sections for achieving higher direct-coupled gain, (v) have a self-biasing portion that incorporates broadband active load, (vi) have termination that enhances and maintains lower frequency response, (vii) have a biasing portion that may include feedback between the active components of distributed stages, (viii) have a biasing portion that provides gain-temperature compensation, (ix) implement an application of the Darlington pair as a transconductor cell of a microwave distributed amplifier topology, and/or (x) be an application of direct-coupled feedback between 2 or more stages of gain within a distributed amplifier.

BRIEF DESCRIPTION OF THE DRAWINGS

These and other objects, features and advantages of the present invention will be apparent from the following detailed description and the appended claims and drawings in which:

FIG. 1 is a diagram illustrating a conventional Darlington amplifier;

FIG. 2 is a diagram illustrating conventional distributed amplifiers being directly cascaded by an emitter follower;

FIG. 3 is a diagram illustrating conventional distributed amplifiers being directly cascaded by diodes;

DETAILED DESCRIPTION OF THE PREFERRED EMBODIMENTS

The present invention applies the distributed amplification technique that may enhance a traditional feedback amplifier to obtain higher gain and bandwidth per unit area and power consumption than a traditional distributed amplifier. The present invention may directly (DC) couple a number of distributed amplifier stages in order to increase gain and/or bandwidth (BW) without compromising low frequency performance. Another feature of the present invention implements a biasing circuit to provide active load terminations in order to extend the low frequency response while using fewer off-chip components.

Figure 6:
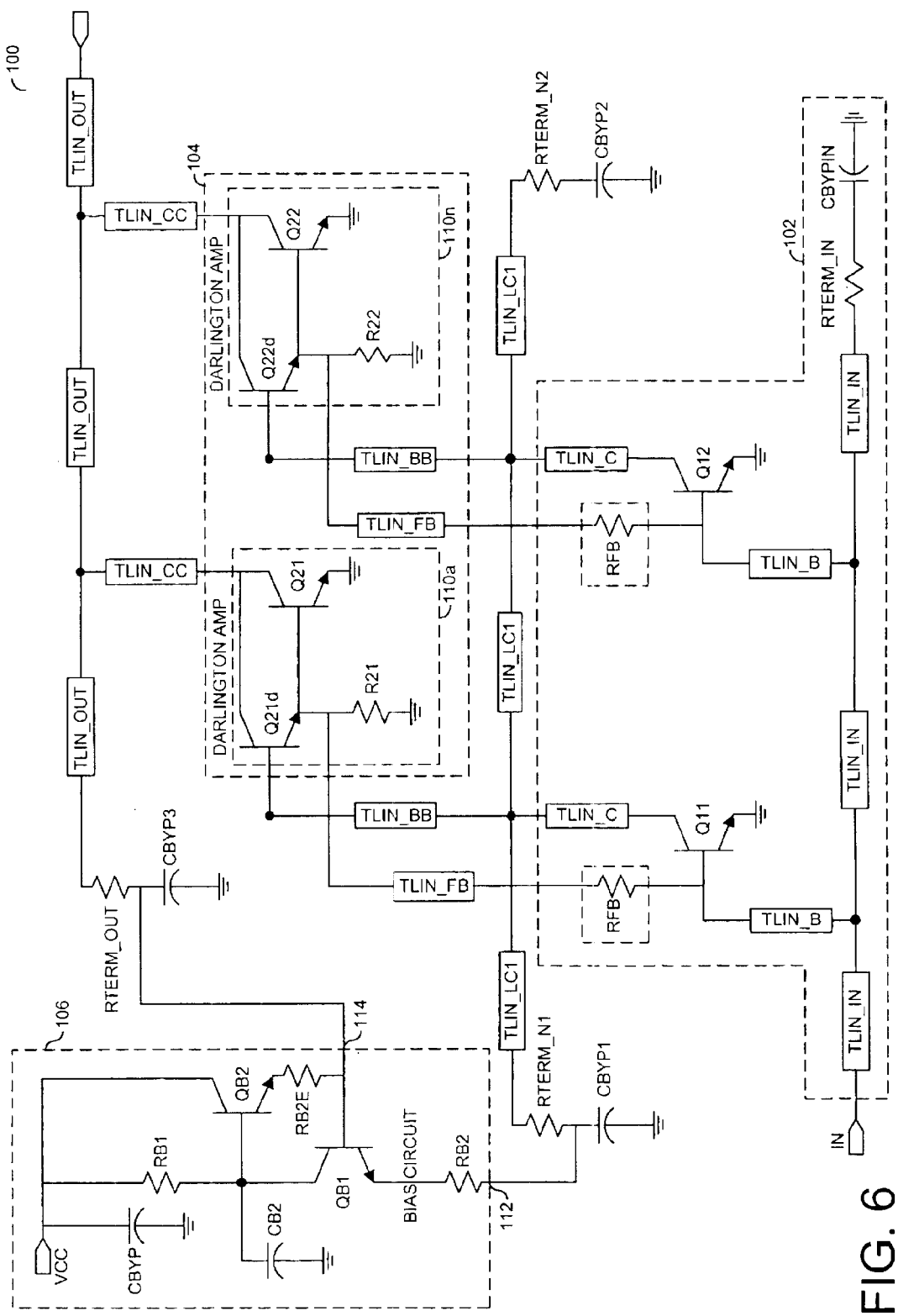
FIG. 6 is a circuit diagram illustrating a direct coupled distributed amplifier in accordance with a preferred embodiment of the present invention.

Referring to FIG. 6, a circuit 100 is shown implementing a preferred embodiment of the present invention. The circuit 100 illustrates a two section distributed 2-stage cascaded amplifier. The circuit 100 generally comprises an input stage 102, an output (or amplifier) stage 104, and a bias stage 106.

The input stage 102 may be implemented as a distributed common-emitter amplifier. The input stage 102 generally comprises a transistor Q11 and a transistor Q12. The transistors Q11 and Q12 are generally directly DC coupled to the output stage 104. The input stage 102 may be modified to implement Darlington pairs (not shown), similar to the output stage 104.

The output stage 104 generally comprises a number of distributed Darlington amplifier stages 110a–110n. The output stage 104 may be implemented as a distributed direct-coupled amplifier. The stage 110a generally comprises a transistor Q21d, a transistor Q21, and a bias resistor R21. The stage 110n generally comprises a transistor Q22d, a transistor Q22, and a bias resistor R22. While a distributed Darlington amplifier has been described as an example implementation of the second stage 104, other implementations, such as a common-emitter, cascode, emitter-follower/common-emitter or other device configuration using a combination of FET and BJT technologies may be implemented to meet the design criteria of a particular implementation.

An intermediate broadband transmission line (TLIN__LC1) is generally shared between the input stage 102 and the output stage 104. The transmission line TLIN__LC1 may be optimized to other than a 50 ohm system impedance in order to enhance RF performance. The transmission line TLIN__LC1 may be implemented as a high impedance, high inductance transmission line.

The bias stage 106 may be implemented as a self bias portion that may (i) regulate the bias current of both the input stage 102 and the amplifier stage 104, (ii) provides a broadband low impedance termination for an output transmission line (e.g., TLIN__OUT) and intermediate synthetic transmission line TLIN__LC1, (iii) employs a feedback resistor which provides DC stabilization and/or enhance RF performance, (iv) provides gain-temperature compensation. The bias stage 106 may be implemented as an active bias circuit.

Further, the input stage 102 and the amplifier stage 104 may be scaled to include more sections along a synthetic input, the intermediate, and the output transmission lines, TLIN__IN, TLIN__LC1, and TLIN__OUT, respectively (to be described in more detail in connection with FIGS. 7 and 8). The amplifier 104 may be scaled to include more direct-coupled cascaded stages along the cascaded transmission line path TLIN__B, TLIN__C, TLIN__BB, TLIN__CC, effectively directly cascading more distributed stages.

The transmission lines TLIN__IN and TLIN__B generally construct an artificial (or synthetic) transmission line with the capacitive input impedance of the common-emitter transistors Q11 and Q12. The input transmission line TLIN__IN is terminated by an R-C network comprising a resistor RTERM__IN and a capacitor CBYPIN. An intermediate synthetic transmission line TLIN__LC1 generally comprises a line TLIN__C1, an output feed line TLIN__C of the common-emitter stage 102 and input feed line TLIN__BB. The synthetic transmission line TLIN__LC1 generally works in combination with the effective shunt capacitance provided by the output impedance of the transistors Q11 and Q12 and input impedance of the Darlington amplifier cells 110a–110n. The outputs of the common emitter stage 102 is directly-coupled to the input of the output stage 104, thus preserving baseband performance. The intermediate transmission line TLIN__LC1 is terminated on one side by an RC termination comprising the resistor RTERM__N2 and the capacitor CBYP2, and on the other side by the resistor RTERM__N1 and the capacitor CBYP1. In addition, the active bias network 106 may also provide a controlled low impedance at a port 112 in parallel with the capacitor CBYP1 and series with the resistor RTERM__N1. The active load generally extends the low frequency response by providing a low frequency bypass impedance. The low frequency impedance is approximately equal to $Rb2+1/gmb1+(1/gmb2+Rb2e)/Beta+(Rb1/Beta^2)+1/sCb2*Beta^2$, effectively extending the bypass capacitance CBYP1 to $(Cbyp+Cb2*Beta^2)$.

As discussed, the distributed output stage 104 generally comprises a plurality of Darlington Amplifier cells 110a–110n. In the illustration shown in FIG. 6, the Darlington cell 110a generally comprises a transistor Q21d and a transistor Q21 and a bias resistor R21. The Darlington cell 100n generally comprises a transistor Q22d and a transistor Q22 and a bias resistor R22. The Darlington cells 110a–110n may be used in place of common emitter transistors. In general, the Darlington cells 110a–110n have higher input impedance and lower effective input capacitances, lower input loss, and/or ability to provide higher output current and voltage drive levels when compared with other cells. In addition, the Darlington cells 110a–110n provide approximately two diode level shifts which sets the collector to emitter voltage VCE on the common emitter transistors Q11 and Q12. The level shift enables the direct DC coupling of an RF/DC feedback resistor RFB and transmission line (e.g., Tlin-fb) from the emitters of the transistors Q21d and Q22d to the bases of the transistor Q11 and Q22. The DC coupling may set up a DC self-biasing loop in addition to providing control of the transimpedance, gain, and broadband input impedance of the amplifier. While Darlington cells may be preferred, a common-emitter/common-emitter, common-collector/common-emitter, common-emitter/common-source, or common-source/common-emitter cell configuration may be used while achieving direct-coupled feedback from the output stage to the input stage.

The output synthetic transmission line TLIN_OUT generally is synthesized by the transmission lines TLIN_OUT and TLIN_CC in conjunction with the effective output capacitance impedances of the Darlington amplifier cells 110a–110n. An output transmission line R-C termination generally comprises a resistor RTERM_OUT and a capacitor CBYP3. The active bias circuit 106 is configured and applied in parallel to the termination bypass capacitor CBYP3 and provides both an apparatus for self-biasing the direct-coupled distributed amplifier 104 with a single supply voltage (e.g., VCC). The bias circuit 106 also provides a controlled low impedance at a port 114 in parallel with the termination bypass capacitor CBYP3 in order to extend the low frequency performance of the amplifier 100. The effective impedance at port 114 is expressed by the following equation:

$$Rb2e+1/gmb2+(Rb1/\text{Beta}1)\|(1/sCb2*\text{Beta}1).$$

This increases the effective bypass capacitance from the capacitance CBYP to (CBYP3+CBYP2*Beta), since there is effectively a shunt capacitor of CBYP2*Beta in parallel with CBYP3.

The direct coupled distributed amplifier 100 may be extended to N number of multiple sections along the synthetic transmission lines TLIN_IN, TLIN_LC1 and TLIN_OUT. The direct-coupled distributed amplifier 100 may be extended to M number of cascaded stages (e.g., from input to output) in order to increase the direct-coupled gain performance. Furthermore, the Darlington amplifier cells 110a–110n may be replaced by an emitter-follower/common-source or common-source/common-emitter transistor configuration without departing from the spirit of the direct-coupled feedback nature of the invention.

The biasing scheme may be expressed by the following approximate equations:

1. $Ic1=Ic11=Ic12=(Vcc-4*Vbe-Ic2*Rb2e)/[2*(Rb1+Rb2+R\text{term}\_n1)]$

2. $Ic2=Ic22=Ic21=Ic1*(Ae2/Ae1)$ where $Ae1$=the area of Q11 and Q12, $Ae2$=the area of Q21 and Q22)

3. $Ic2d=Ic22d=Ic21d=Vbe/R22=Vbe/R21$

4. $Vce1=Vce11=Vce12=2Vbe$

5. $Vce\_\text{darlington}=Vcc-2*Ic1*Rb1-Vbe-2*(Ic2+Ic2d)*(Rb2e+R\text{term}\_\text{out})$ Temperature dependence 1. $\delta Ic2d/dT=(\delta Vbe/\delta T)*(1/R22)$ 2. $\delta Ic1/\delta T=\delta Ic2/\delta T=(\delta Vbe/\delta T)*[4-(2/Rb2e)*(\delta Ic1/\delta T)]/[2*(Rb1+Rb2+R\text{term}\_n1)]$ where $(\delta Vbe/\delta T)=-1$ to $-2$ mV/C depending on the technology.

Note these equations are approximate and will depart from the ideal case when DC beta becomes extremely low (<10) or RFB becomes significantly high (>500 ohms).

The direct coupled distributed amplifier 100 was implemented using commercially available InP heterostructure bipolar transistor (HBT) technology with fT=175 GHz and Fmax=200 GHz. However, the present invention may be applied to other semiconductor technologies such as SiGe HBT, GaAs HBT, pseudomorphic high-electron mobility transistor (PHEMT), Bi-CMOS and other appropriate technologies.

The direct coupled distributed amplifier 100 may be particularly useful for a 43 Gb/s return-to-zero photoreceiver application. The bandwidth needed is greater than 43 GHz with a target of 50 GHz. Simulation of this design are shown compared to a traditional resistive feedback pre-amplifier transimpedance design. The target small signal gain and bandwidth is 10 dB and 50 GHz, respectively. Direct-coupled baseband gain performance below 1 MHz was also a target specification.

The new DC coupled distributed amplifier 100 can be useful in many applications inclusive of, but not limited to (i) Mach-Zenhder optical modulator drivers, (ii) Eletro-absorption modulator drivers, (iii) Transimpedance amplifiers, (iv) Wide-band switch architectures, (v) Wideband 2–18 GHz electronic warfare (EW), (vi) Wideband test equipment, and/or (vii) Wideband Bi-CMOS amplifiers for 10 and 40 Gb/s fiber applications as well as 10 GHz microprocessor applications.

The present invention may be used to satisfy a 40 Gb/s Return-to-Zero transimpedance preamplifier application which may need bandwidths in excess of 50 GHz. The product may be implemented using InP single heterojunction bipolar transistor (SHBT) process technology available from Global Communication Semiconductors, Inc. (GCS). However, other technologies may be used. This circuit 100 can also be offered as a wide-band instrumentation amplifier for test equipment. Reconfigured, the circuit 100 may also be applied to wideband military EW radar and communication systems and/or fiber optic transmitter systems where high broadband power is needed. The circuit 100 may have applicability to microwave switch buffer amplification (e.g., single pole double throw (SPDT), single pole quad throw (SP4T), etc.) or active switch applications where baseband performance down to 10 KHz is needed.

Figure 7:
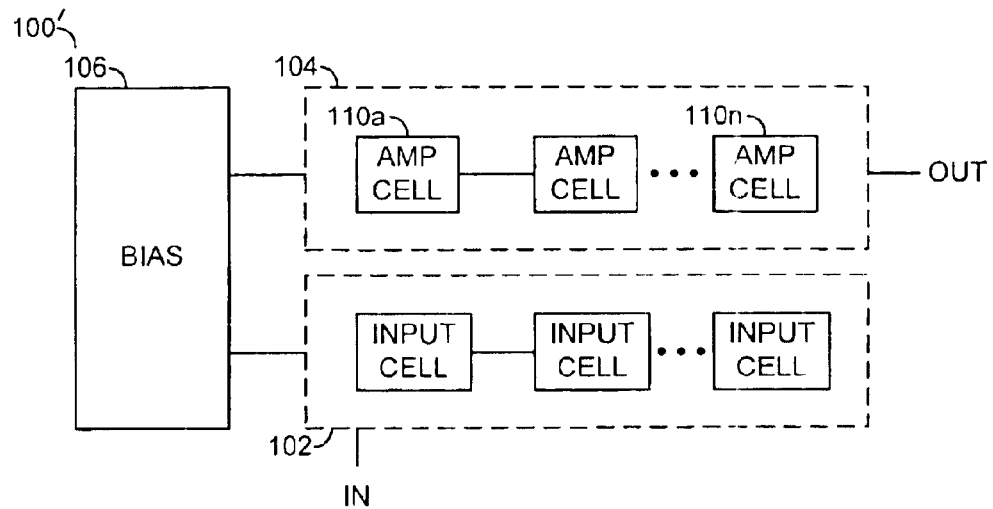
FIG. 7 is a diagram illustrating an example for extending the number of amplifier cells.

Referring to FIG. 7, an example of a circuit 100' is shown illustrating a plurality of elements 110a–110n. A number of amplifier cells 110a–110n are shown in the horizontal direction. A corresponding number of input cells (e.g., the transistors Q11 and Q12) are also shown.

Figure 8:
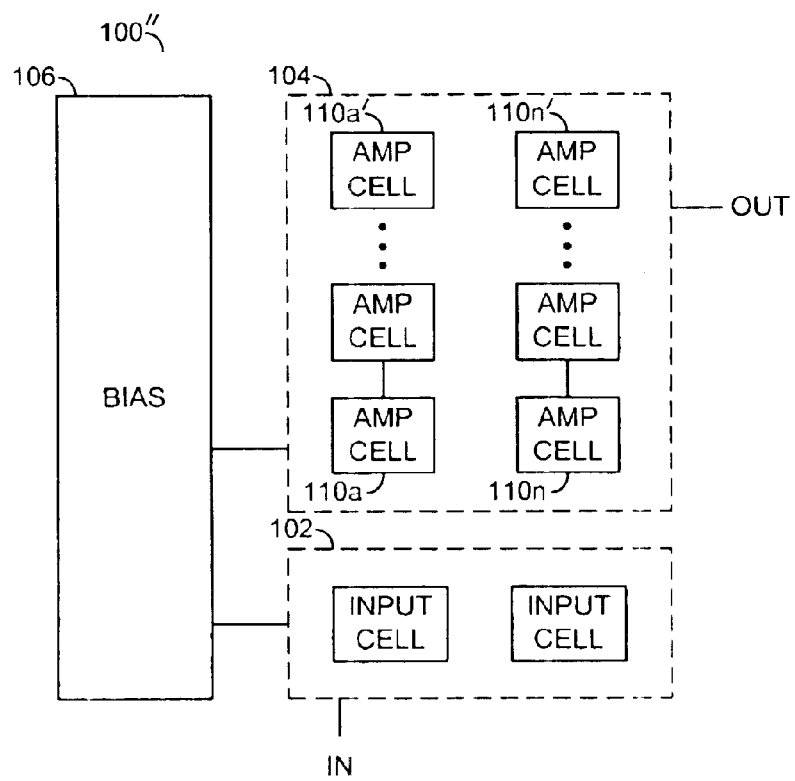
FIG. 8 is a diagram illustrating another example for extending the number of amplifier cells.

Referring to FIG. 8, an example of a circuit 100'' is shown illustrating a plurality of elements 110a'–110n'. A number of amplifier cells 110a–110a' and 110n–110n' are shown implemented in the vertical direction. The number of input cells (e.g., the transistors Q11 and Q12) generally match the number of columns of cells (e.g., 110a–110n' and 110n–110n'). In general, the number of vertical cells and the number of horizontal cells may be increased or decreased to meet the design criteria of a particular implementation.

Figure 9:
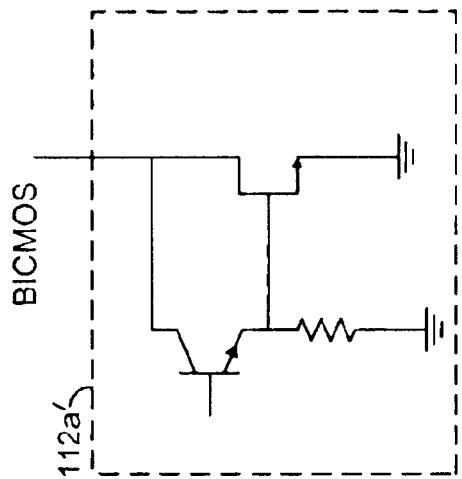
FIG. 9 is an example of an alternate amplifier cell.
Figure 9:
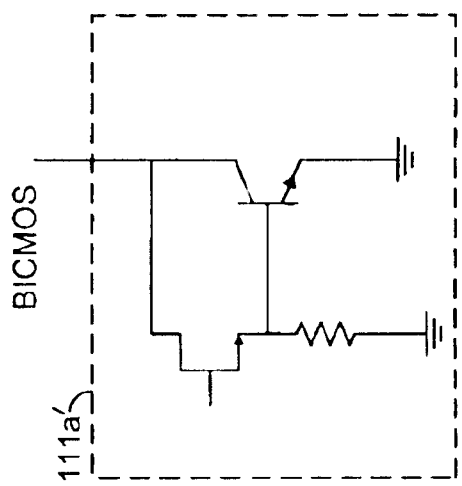
Figure 9:
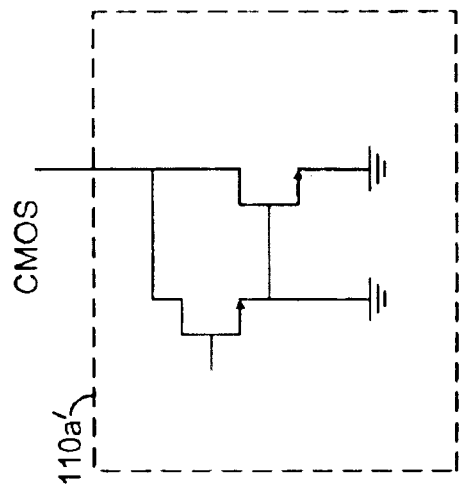

Referring to FIG. 9, an example of alternate amplifier elements 110a', 111a', 112a' is shown implemented with CMOS Field Effect Transistors (FETs). The amplifier cells 110a–110n of the output stage and/or the transistors Q11 and Q12 of the input stage 102 may be implemented using bipolar transistors FETs, or other transistor types.

The following circuit simulations of the invention are based on a commercially available InP HBT technology with fT=150 GHz and fmax>200 GHz. The simulations were executed using ADS software by Agilent. The target application is a 43 Gb/s Return-to-Zero optical receiver which requires a baseband to 50 GHz transimpedance pre-amplifier. The invention is compared with a traditional pre-amplifier simulated in the same technology.

Figure 10:
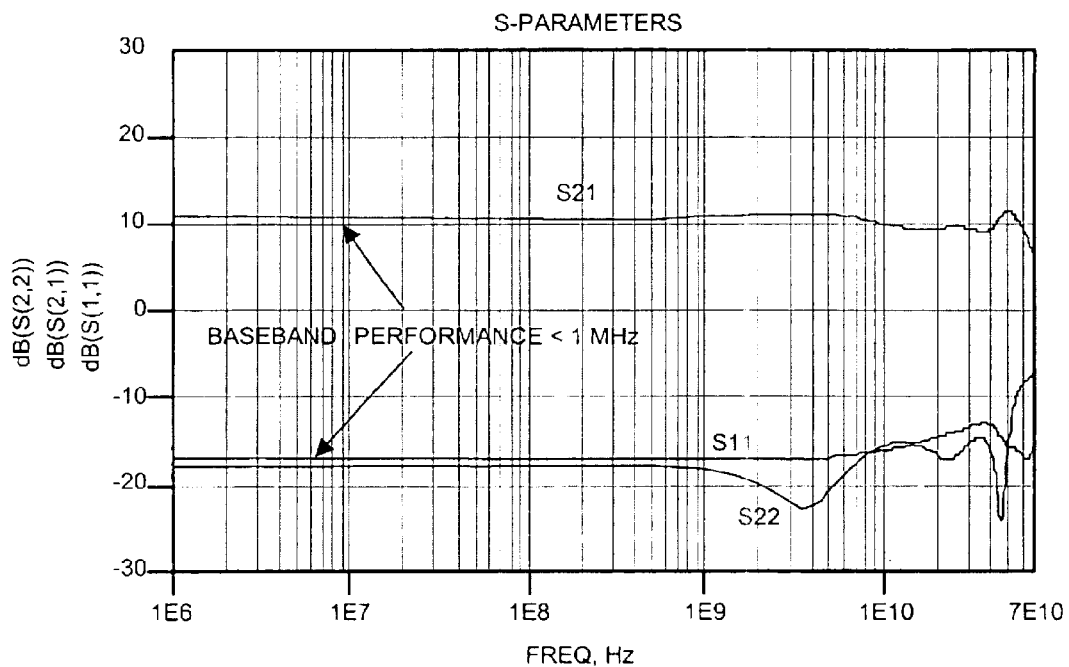
FIG. 10 is a graph illustrating a multi-decade response of the present invention.

FIG. 10 is a graph illustrating a multi-decade response of the present invention. Baseband, and high 3 dB bandwidth is achieved by employing the circuit 100. Simulation of the forward transmission scatter parameter (e.g., S21) predicts a gain of approximately 10 dB beyond 43 GHz. The input reflection scatter parameter (erg., S11) generally remains well below −10 dB beyond 43 GHz. The output reflection scatter parameter (e.g., S22) also remains below −10 dB below approximately 52 GHz.

Figure 4:
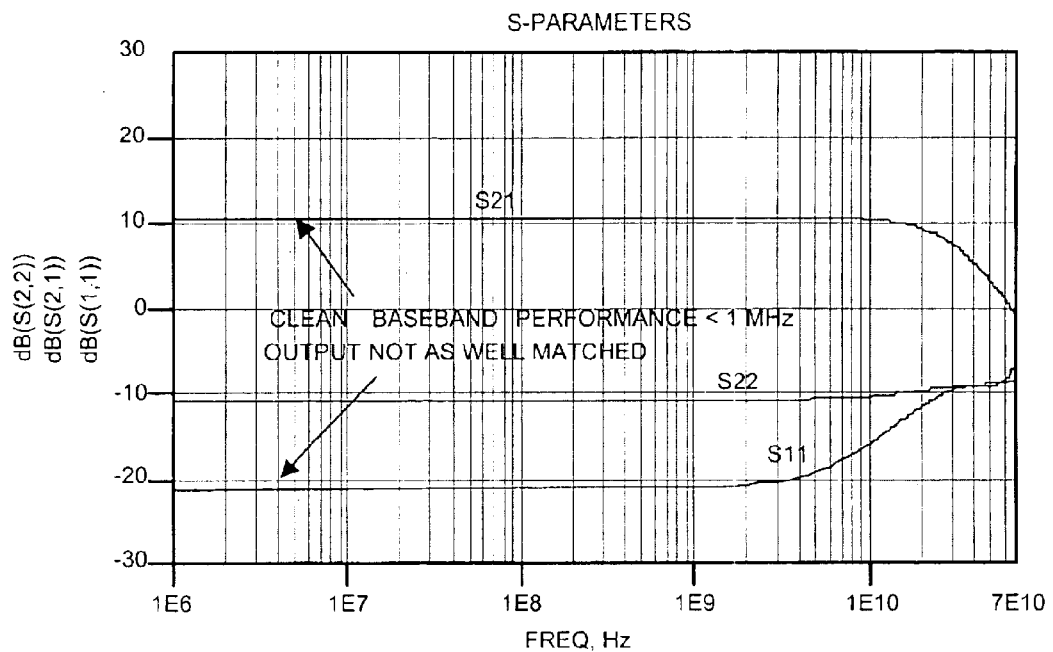
FIG. 4 is a graph illustrating a traditional analog feedback amplifier multi-decade response.
Figure 5:
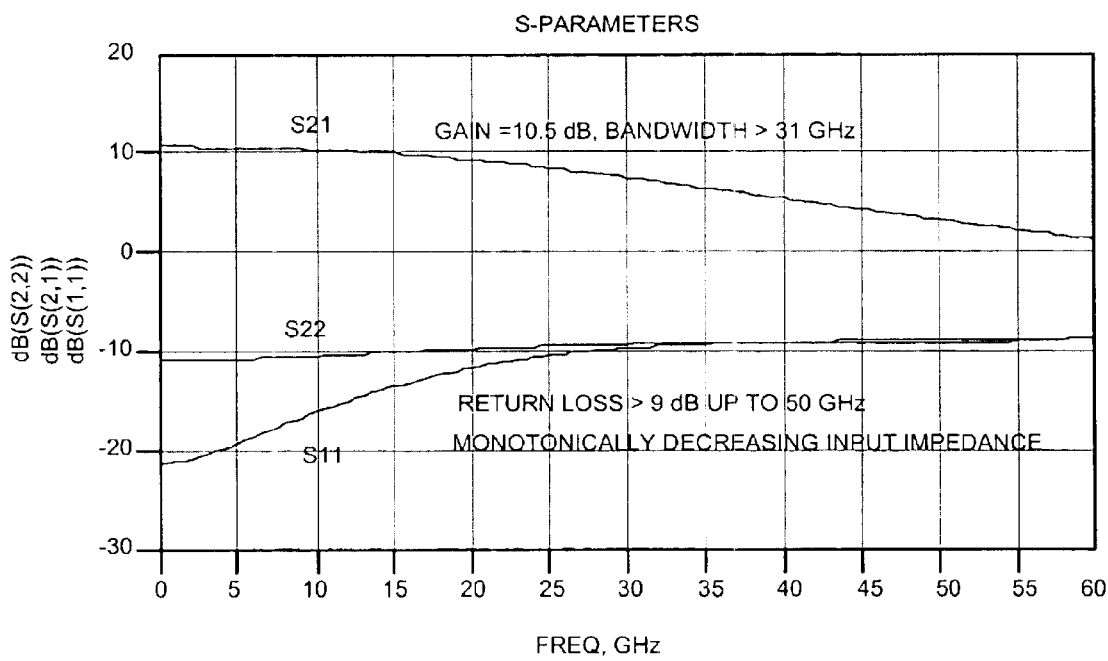
FIG. 5 is a graph illustrating a traditional analog feedback amplifier high frequency response.
Figure 11:
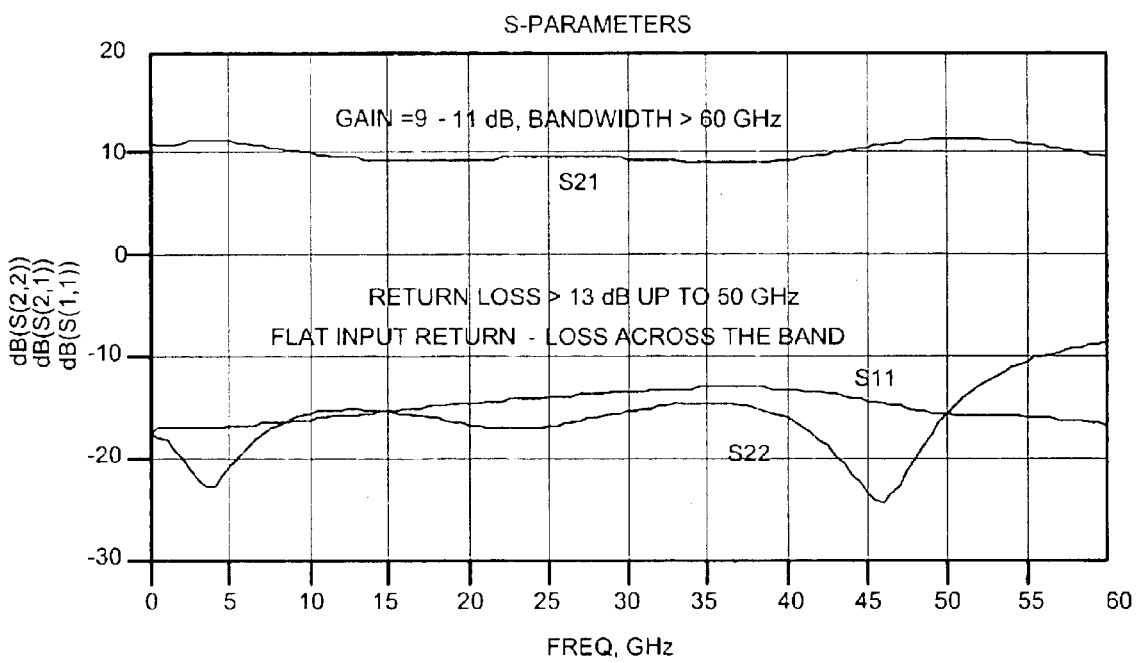
FIG. 11 is a graph illustrating a direct, coupled distributed amplifier high frequency response.

FIG. 11 is a graph illustrating high frequency response of the present invention. Bandwidth is generally enhanced by a factor of two when compared with the conventional approach of FIG. 5. A flat input impedance (e.g., as indicated by parameter S11) is generally achieved over the frequency band which helps produce a flatter transimpedance bandwidth response. In contrast, conventional distributed amplifiers will appear to have periodic peaks and valleys in the input impedance. Typically the peaks in conventional amplifiers can be as high as −10 dB return loss and valleys can be as low as −30 dB return-loss. The difference in these peaks and valleys are due to the periodic change in input impedance which may create ripple in the transimpedance bandwidth response. The topology of this invention, especially the featured feedback resistance RFB, allows control of the impedance (e.g., obtaining a flatter input impedance).

Figure 12:
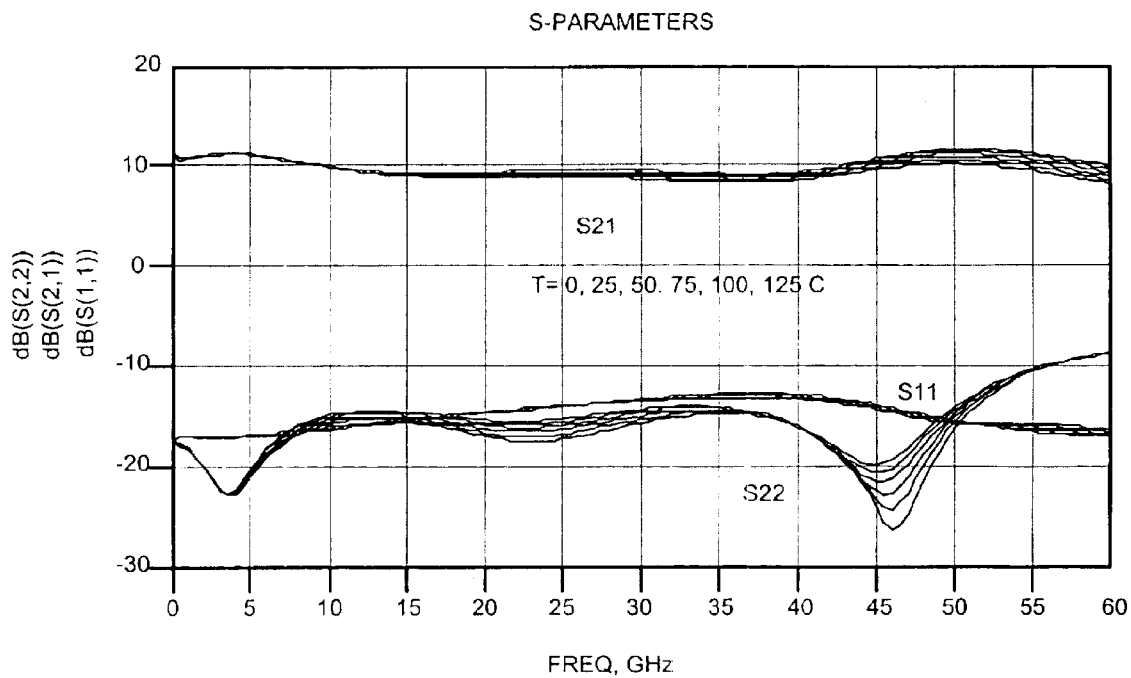
FIG. 12 is a graph illustrating a direct coupled distributed amplifier S-parameter temperature dependence.

FIG. 12 is a graph illustrating temperature dependent S-parameter of the present invention. The self bias circuit 106 provides first order gain compensation (e.g., <0.25 dB at DC and <2 dB at 50 GHz) over temperature and frequency (e.g., as indicated by the forward transmission gain S21 and the input reflection coefficient S11). Low gain temperature compensation is achieved by employing a first order proportional to absolute temperature (PTAT) bias scheme which compensates for transconductance temperature dependence.

Figure 13:
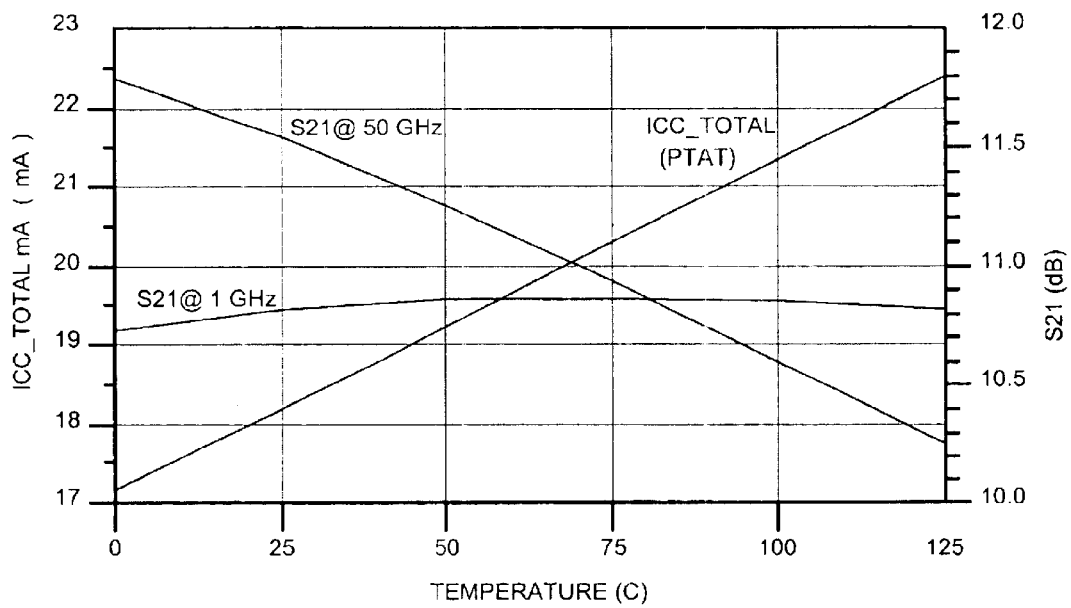
FIG. 13 is a graph illustrating a self bias compensating for gain over temperature where ICC is nearly proportional to T(K).

FIG. 13 is a graph illustrating the results of bias circuit 106 compensating for gain over temperature with ICC being nearly proportional to T(K). The bias circuit 106 operates nearly PTAT to provide first order gain-temperature compensation. At low frequencies (e.g., around 1 GHz), the temperature dependence of the device transconductance (e.g., gm) determines the temperature dependence of low frequency gain. A PTAT type of biasing circuit 106 helps insure constant gm versus temperature. At 1 GHz, the forward transmission gain S21 is maintained to within 0.2 dB over the 0 C to 125 C temperature range. At higher frequencies (e.g., 50 GHz), the forward transmission gain S21 change is due to the other device parameter variations with temperature. The main parameters affecting the high frequency gain (in addition to the device transconductance gm) are Ccb, Rb, and fT. Still, with the PTAT biasing scheme, the high frequency forward transmission gain S21 (e.g., 50 GHz) degrades by only by 1.5 dB over the 0 C to 125 C temperature range.

The transistors described herein may be implemented as bipolar junction transistors (BJTs), heterojunction bipolar transistors (HBTS) or BiCMOS transistors. However, other transistors with similar characteristics may be implemented to meet the design criteria of a particular implementation. In particular, the various transistors of the present invention may be implemented using a variety of process technologies. For example, any or all of Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    an input stage configured to generate a plurality of intermediate signals in response to an input signal;
    an output stage (i) DC coupled to said input stage and (ii) configured to generate an output signal in response to said intermediate signals, wherein said output stage comprises a plurality of distributed amplifiers each configured to receive one of said intermediate signals; and
    a bias stage (i) connected between said input stage and said output stage and (ii) configured to adjust an input impedance of the input stage.

2. The apparatus according to claim 1, wherein said output stage comprises a distributed microwave amplifier comprising a synthesized input transmission line and a synthesized output transmission line.

3. The apparatus according to claim 1, wherein said input stage and said output stage are DC coupled through a first transmission line.

4. The apparatus according to claim 1, wherein said bias circuit comprises a broadband active load.

5. The apparatus according to claim 2, wherein said bias stage and said output stage are coupled through a second transmission line.

6. The apparatus according to claim 3, wherein said input signal is coupled to said input stage through a third transmission line.

7. The apparatus according to claim 2, wherein said transmission line comprises a synthetic transmission line.

8. The apparatus according to claim 1, wherein each of said amplifiers comprises a Darlington amplifier.

9. The apparatus according to claim 1, wherein each of said amplifiers comprises a common-emitter/common-collector cell.

10. The apparatus according to claim 1, wherein each of said amplifiers comprises a common-collector/common-emitter cell.

11. The apparatus according to claim 1, wherein each of said amplifiers comprises a common-source/common-emitter cell.

12. The apparatus according to claim 1, wherein each of said amplifiers comprises a common-emitter/common-source cell.

13. The apparatus according to claim 1, wherein said input stage comprises a distributed input stage comprising a plurality of input cells each corresponding to one of said plurality of distributed amplifiers of said output stage.

14. The apparatus according to claim 1, wherein said bias circuit is further configured to provide proportional to absolute temperature (PTAT) compensation.

15. The apparatus according to claim 1, wherein said bias circuit is further configured to provide gain-temperature compensation.

16. The apparatus according to claim 1, wherein said bias circuit is further configured to provide low impedance termination on said output stage and said plurality of distributed amplifiers.

17. The apparatus according to claim 1, wherein each of said distributed amplifiers is connected to said input stage through a feedback resistor.

18. The apparatus according to claim 1, wherein said distributed amplifiers are implemented using a BiCMOS process.

19. The apparatus according to claim 1, wherein said input stage is directly DC coupled to said output stage.

20. The apparatus according to claim 1, wherein said apparatus implements cascadable wide band performance.

21. The apparatus according to claim 11, wherein the greater the number of said plurality of cells, the greater a direct coupled gain of said apparatus.

22. The apparatus according to claim 1, wherein said input stage, said output stage and said bias stage include termination to enhance and maintain low frequency response.

23. The apparatus according to claim 1, wherein said bias stage implements a feedback between said input stage and said output stage.

24. The apparatus according to claim 1, wherein said apparatus provides gain-temperature compensation.

25. The apparatus according to claim 1, wherein said apparatus is implemented in a microwave distributed topology.

26. An apparatus comprising:

means for generating a plurality of intermediate signals in response to an input signal using a distributed input stage;

means for generating an output signal in response to said intermediate signals, wherein said output means comprises a plurality of distributed amplifiers each configured to receive one of said intermediate signals;

means for DC coupling (i) said means for generating said output signal and (ii) said means for presenting said intermediate signals; and bias means for adjusting an impedance of said input signal.

27. A method for generating an output signal in response to an input signal, comprising the steps of:

(A) generating a plurality of intermediate signals in response to said input signal;

(B) generating an output signal in response to said intermediate signals using a plurality of distributed amplifiers each configured to receive one of said intermediate signals;

(C) DC coupling said intermediate signals to said output signal; and (D) biasing said intermediate signals to adjust an impedance of said input signal.

* * * * *